(12) United States Patent
Harada (10) Patent No.: US 6,809,342 B2
(45) Date of Patent: Oct. 26, 2004

(54) LIGHT-EMITTING DEVICE AND MANUFACTURING METHOD THEREOF

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/407,067

(22) Filed: Apr. 3, 2003

(65) Prior Publication Data

US 2003/0230751 A1 Dec. 18, 2003

(30) Foreign Application Priority Data

May 31, 2002 (JP) ........................................ 2002-160574
Dec. 27, 2002 (JP) ........................................ 2002-379499

(51) Int. Cl.$^7$ ............................................... H01L 27/15
(52) U.S. Cl. ........................................ 257/79; 257/98
(58) Field of Search ............................. 257/79, 98, 99, 257/100, 680

(56) References Cited

U.S. PATENT DOCUMENTS

| | | | |
|---|---|---|---|
| 5,959,316 A | 9/1999 | Lowery ........................ | 257/98 |
| 6,340,824 B1 | 1/2002 | Komoto et al. ............... | 257/99 |
| 6,373,188 B1 | 4/2002 | Johnson et al. .............. | 313/506 |
| 2003/0230751 A1 * | 12/2003 | Harada ......................... | 257/80 |

FOREIGN PATENT DOCUMENTS

| | | |
|---|---|---|
| JP | 10-107325 | 4/1998 |
| JP | 10-190065 | 7/1998 |
| JP | 10-190066 | 7/1998 |
| JP | 10-242513 | 9/1998 |
| JP | 2001-127346 | 5/2001 |
| JP | 2001-135861 | 5/2001 |
| JP | 2001-156338 | 6/2001 |
| JP | 2001-177153 | 6/2001 |
| JP | 2001-196639 | 7/2001 |
| JP | 2001-210872 | 8/2001 |
| JP | 2001-217466 | 8/2001 |
| JP | 2001-230451 | 8/2001 |
| JP | 2001-345483 | 12/2001 |
| JP | 2002-57375 | 2/2002 |

* cited by examiner

Primary Examiner—Mark V. Prenty
(74) Attorney, Agent, or Firm—Weingarten, Schurgin, Gagnebin & Lebovici LLP (57) ABSTRACT

In the light-emitting device provided with the conventional wavelength converter, colors became irregular, and light radiated to a side of the semiconductor light-emitting element from the wavelength converter could not be used as radiation light, thus lowered the conversion efficiency. The present invention improves the availability of the light from the wavelength converter 5 and resolves the problems by realizing a composition of an LED lamp, wherein a light-radiation-direction-limiter 4a and reflector 4b around it are mounted on a substrate 4, a wavelength converter 5 is mounted on a proper position to cover a part of the light-radiation-direction-limiter 4a and the reflector 4b, and among the light whose wavelength gets converted from fundamental wavelength-light into wavelength-converted light at the wavelength converter 5, both the wavelength-converted light transmitted through the aforementioned wavelength converter 5 and radiated to the front face as direct light, and the wavelength-converted light radiated to the inner face of the wavelength converter 5, by reflecting towards the radiation direction of this light-emitting 1 by the reflector 4b, can be taken out as output light.

27 Claims, 4 Drawing Sheets

LIGHT-EMITTING DEVICE AND MANUFACTURING METHOD THEREOF

BACKGROUND OF THE INVENTION

1. Field of the Invention

The present invention concerns a light emitting diode (light-emitting device, hereinafter), and more particularly, a light-emitting device having an object of obtaining different luminous colors by using a wavelength converter for the luminous body from a tip (semiconductor light-emitting element, hereinafter) of the light emitting diode, and a manufacturing method thereof.

2. Detailed Description of the Prior Art

As LED lamp (light-emitting device) using the conventional wavelength converter, a white light-emitting LED, combining an LED tip emitting blue light and a YAG (yttrium, aluminum, garnet)-type phosphor converting blue light into yellow, is known. Moreover, a white light-emitting LED, combining an LED tip emitting ultraviolet light and a white light-emitting phosphor, has been proposed. (Refer to the patent document 1, for example).

Patent Document 1

Japanese Patent Laid-Open No. 1999-242513

However, in the conventional composition of the LED lamp (light-emitting device) described above, even when the phosphor is dispersed evenly in a light-transmittance-sealing-materiel, for instance, making the dispersion uneven and the luminous color irregular, the phosphor precipitates and dispersion of the phosphor gets uneven because of the difference of the specific gravity between the light-transmittance-sealing-materials and phosphor before the light-transmittance-sealing-materials for sealing the transmitting light become hard, which is problematic.

In addition, even if it is possible to disperse the phosphor evenly so as to prevent the color from becoming irregular, given that the additional amount of phosphor is fixed, it is inevitable that the luminous color of the light-emitting device changes from the yellow spectrum to the blue spectrum as an electric current value increases because of the variation in amount of the irradiated blue light and the variation in the electric current value impressed the LED tip (semiconductor light-emitting element), which deteriorates the color reproducibility.

When adopting a semiconductor light-emitting element radiating a light particularly containing much ultraviolet components, in such a composition to make use of the white light obtained by transmitting it through the phosphor, the ratio of the ultraviolet transmitting without any contacts with the phosphor increases, when the amount of annex to the phosphor is low, which, in turn, makes the light-emitting device low in conversion efficiency and dark, and causes a problem of ultraviolet radiation, assumed to be harmful to life, outside the light-emitting element.

Moreover, the capture rate of ultraviolet certainly improves, by increasing the amount of the annex to phosphor. Though it is possible to reduce the amount of ultraviolet radiated outside the light-emitting element, the phosphor itself becomes lower in transparency, thereby lowers the total transmittance as sealing materials and, as a result, provoking an impropriety of being unable to obtain a bright light-emitting device in any way, constituting a problem to be resolved.

SUMMARY OF THE INVENTION

The present invention is to resolve the problems by providing a light-emitting device, which comprises a substrate, a semiconductor light-emitting element mounted on the substrate, and a wavelength converter created by a phosphor releasing a wavelength-converted light, which is different from the fundamental wavelength-light radiated from the aforementioned semiconductor light-emitting element, wherein:

a light-radiation-direction-limiter in the shape of a horn where its inner wall is opening upward on a substantially central portion having a function to limit the direction of the radiation of light from the aforementioned semiconductor light-emitting element, and a reflector around the light-radiation-direction-limiter. The aforementioned wavelength converter is arranged to cover an opening of the aforementioned light-radiation-direction-limiter and not to contact with the limiter's edge. Moreover, the combination of both of the wavelength-converted light transmitted through the aforementioned wavelength converter and radiated in the radiation direction of this light-emitting element, fundamental wavelength-light reflected to the inner face of the wavelength converter, among the light coming out of the aforementioned semiconductor light-emitting element, which reaches the aforementioned wavelength converter, and/or the light reflecting wavelength-converted light to the radiation direction of this light-emitting with the aforementioned reflector, can be taken out as the output light, as a concrete mean to solve the aforementioned problems of the prior art.

BRIEF DESCRIPTION OF THE DRAWINGS

These and other objects and advantages of the present invention will become clear from the following description with reference to the accompanying drawings, wherein.

Symbols

1 Light-emitting device
2 Semiconductor light-emitting element
3 Submount substrate
4 Substrate
   4a Light-radiation-direction-limiter
   4b Reflector
   4c Electro-conductive portion
   4d Junction portion 5 Wavelength converter
6 Transparent aperture plate
7 Reflection film
8 Transparent sealing member
9 Second wavelength converter

DETAILED DESCRIPTION OF THE PREFERRED EMBODIMENT

Figure 1:
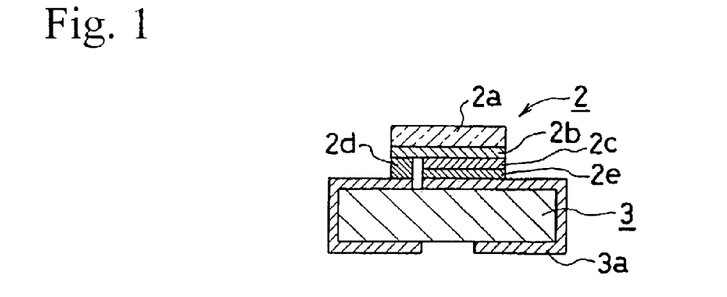
FIG. 1 is a cross section showing the composition of the semiconductor light-emitting element, which is an essential part of the light-emitting device according to the present invention.

Now, the present invention shall be described in detail based on embodiments shown in the drawings. FIG. 1 shows a cross section of a semiconductor light-emitting element 2, which is a light-emitting element of a light-emitting device 1. This semiconductor light-emitting element 2 is formed of gallium nitrate (GaN) type compound semiconductor. And an n-type semiconductor layer 2b and a p-type semiconductor layer 2c are laminated on the aforementioned transparent substrate 2a, which constitutes a flip chip structure for taking out light through transmission of this transparent substrate 2a by directing the aforementioned transparent substrate 2a to the upper face.

Then, an n-type ohmic electrode 2d connected to the aforementioned n-type semiconductor layer 2b and a p-type ohmic electrode 2e connected to the p-type semiconductor layer 2c are connected to an electrode 3a provided as a pair on a submount substrate 3, which enables to realize a power supply for the aforementioned semiconductor light-emitting element 2 with energy.

The semiconductor light-emitting element 2, composed in a form of the aforementioned explanation, can adopt metal material with high optical reflectance as material when forming the aforementioned ohmic electrodes 2d and 2e. The aforementioned semiconductor light-emitting element 2 is provided with an electrode holding up against the light on semiconductor layer 2b and 2c, and has an advantage of improving the amount of light compared to a well-known structure for taking out the light from the sides of electrode face 2d and 2e side. However, the present invention is not limited to the flip tip structure and can also be executed, even if it is the semiconductor light-emitting element 2 as the well-known structure.

The wavelength of the light radiated from the aforementioned semiconductor light-emitting element 2 is preferably in a range of 370 mm to 420 mm, which is the wavelength range appropriate for excitation of phosphor. In addition to the aforementioned gallium-nitrate-type compound semiconductor, the semiconductor light-emitting element 2 may also be a luminous layer with, for example, zinc oxide (ZnO)type, zinc sulfide (ZnS)-type, zinc selenide (ZnSe)-type, or Silicone carbide (SiC)-type compound.

Figure 2:
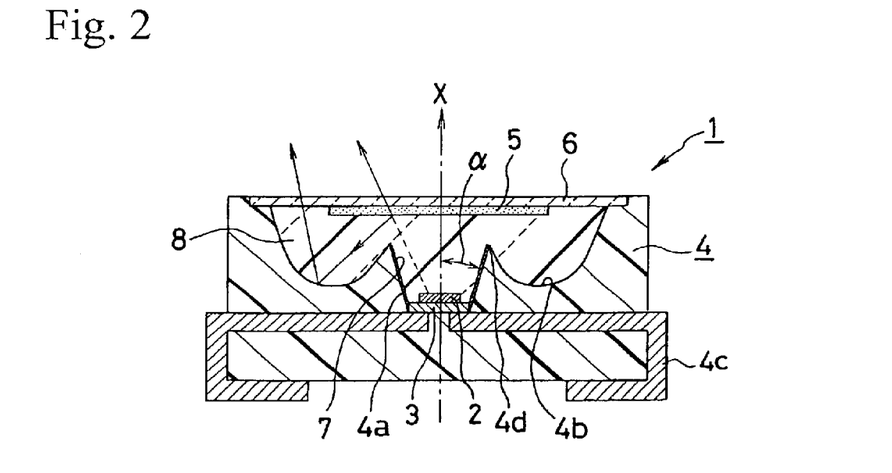
FIG. 2 is a cross section showing the first embodiment of the light-emitting device according to the present invention.

FIG. 2 shows the first embodiment of the light-emitting device 1 concerning the present invention. This light-emitting device 1 uses and is comprised of a semiconductor light-emitting element 2 mounted on a submount substrate 3, a substrate 4 for containing the aforementioned semiconductor light-emitting element 2, a wavelength converter 5 for converting light from the aforementioned semiconductor light-emitting element 2 into white light, and a light-transmittance-sealing-materiel 8 for protecting the aforementioned semiconductor light-emitting element 2 from humidity of the atmosphere outside, which is same as an example of the conventional structure.

Here, in the present invention, the aforementioned substrate 4 is provided with a light-radiation-direction-limiter 4a and a reflector 4b. And the aforementioned light-radiation-direction-limiter 4a is provided substantially in the shape of a horn approximately at the center of the substrate 4, and the aforementioned reflector 4b is provided as a concave surface surrounding the aforementioned light-radiation-direction-limiter 4a. The explanation of the structure of the aforementioned light-radiation-direction-limiter 4a and reflector 4b will be described later in more detail. Besides, an electrode 4c and so on, which supply power to the semiconductor light-emitting element 2 attached to the aforementioned submount substrate 3, are also provided similarly to the examples of the conventional structure.

Further, the aforementioned wavelength converter 5 is provided so as to cover the aforementioned light-radiation-direction-limiter 4a in the present invention. As FIG. 2 illustrates, a transparent aperture plate 6 covering the aforementioned light-radiation-direction-limiter 4a and reflector 4b is provided as an example of formation mode of this wavelength converter 5, and the wavelength converter 5 is formed on a side of this transparent aperture 6 facing the semiconductor light-emitting element 2, namely, on the inner face of the transparent aperture 6, is shown. For this wavelength converter 5, a film is formed by, for instance, silk-screen printing, potting or other proper means.

Here, we would like to describe the composition of the aforementioned light-radiation-direction-limiter 4a and the reflector 4b, and, the range of application of the wavelength converter 5 to the transparent aperture plate 6. First of all, the aforementioned light-radiation-direction-limiter 4a is formed in the shape of a linear horn with an aperture angle α of 10 to 45 in respect to the irradiation axis X so as to limit the light radiated from the semiconductor light-emitting element 2 to a proper angle, in principle, in a range of 180°.

Then, for the aforementioned transparent aperture plate 6, the wavelength converter 5 is formed in film in a range where light from the aforementioned semiconductor light-emitting element 2 is limited by the aforementioned light-radiation-direction-limiter 4a. At this time, if a reflection film 7 that reflects light efficiently is formed by applying, for instance, aluminum, evaporation of silver and so on, barium sulfide, magnesium oxide etc., almost entire light radiated from the semiconductor light-emitting element 2 ends up reaching the wavelength converter 5, and gets converted into a different wavelength, for instance, white light.

At this time, when the aforementioned wavelength converter 5 is excited by the light from the aforementioned semiconductor light-emitting element 2, it turns up to emit light towards almost all directions. Consequently, in a state where the wavelength converter 5 is applied to the transparent aperture plate 6 in the shape of a film, light transmitting through the transparent aperture plate 6 and being radiated to the radiation direction of the original light-emitting device 1, and light radiated to the aforementioned semiconductor light-emitting element 2 side, namely the inner face, turn to be generated.

In short, in a composition where only light radiated in the radiation direction is used as the radiation light of the light-emitting device 1 as in the example of the conventional structure, at most about half of, for instance, white light, converted in the wavelength converter 5, ends up to be available as radiation light from the light-emitting device 1.

In view of the abovementioned, a reflector 4b surrounding the aforementioned light-radiation-direction-limiter 4a from the periphery is provided in the present invention, and this reflector 4b reflects the light radiated towards the inner face from the aforementioned wavelength converter 5. Consequently, the light reflected by the reflector 4b transmits through the transparent portion of the transparent aperture plate 6, where the aforementioned wavelength converter 5 is not applied, becomes available as radiation light for the light-emitting device 1, and according to the present invention, light from both faces of the wavelength converter 5 becomes available. For the reflector 4b as well, it should be noted that it is free to provide the reflection film 7 mentioned above.

As it is evident from the aforementioned explanation, since the aforementioned reflector 4b is installed for the purpose of reflecting light entirely from the wavelength converter 5, if a direct light from the aforementioned semiconductor light-emitting element 2 incidents, ultraviolet and so on contained in this direct light are also reflected and reached the user, which is undesirable. Consequently, the positional relation in respect to the aforementioned light-radiation-direction-limiter 4a is made proper so that the direct light from the semiconductor light-emitting element 2 does not reach the reflector 4b.

The area of the light flux from the semiconductor light-emitting element 2 increases as much as the aforementioned semiconductor light-emitting element 2 and wavelength converter 5 separate far one from the other, a larger area will be required for the wavelength converter 5, resulting in the enlargement in size of the whole light-emitting device 1. Also, the enlargement in area of the light flux from the semiconductor light-emitting element 2 decreases the excitation power to the wavelength converter 5 and the brightness lowers.

Therefore, in the present invention, it is more preferable that the distance between the aforementioned semiconductor light-emitting element 2 and wavelength converter 5 is 10 mm or less. And in this embodiment, the distance between the surface of the semiconductor light-emitting element 2 and the wavelength converter 5 is set to 2 mm and the aforementioned angle of aperture $\alpha$ is set to 15 making the size of the light-emitting device 1 appropriate. It is preferable to set the area ratio of the wavelength converter 5 to the transparent aperture plate 6 to 25 to 75%, and the distance between the semiconductor light-emitting element 2 and the wavelength converter 5, the size of the reflector 4b, the size of the transparent aperture plate 6 may well be set, so that they should be in this range.

Further, when using the light radiated to both faces of a light from the wavelength converter 5, the amount of light transmitting through the wavelength converter 5, in short, light radiated to the transparent aperture plate 6 side, tends to decrease as the film thickness increases. In contrast with this, the amount of light radiated to the side of semiconductor light-emitting element 2 tends to increase up to a certain degree as the film thickness increases.

Here, in this embodiment, since the aforementioned wavelength converter 5 is formed on the transparent aperture plate 6 by using means that can accurately control the film thickness, such as screen-printing, potting by dispenser and so on, it is also easy for the light-emitting device 1 to obtain the maximum amount of light by controlling the film thickness so that the sum of the light transmitting through the wavelength converter 5 and the light radiated to the side of the semiconductor light-emitting element 2.

As for phosphor for composing the wavelength converter 5, it is possible to adopt, for instance, yttrium oxide-type phosphor converting near ultraviolet light into red, zinc sulfide-type phosphor converting orange into green, aluminum-type phosphor converting into blue, halophosphate-type phosphor etc. and triple wavelength-type-white-light phosphor etc., which is a mix of the above phosphors.

Then, a transparent sealing member 8 such as, for instance, transparent silicone resin, low melting-point glass, such as oxynitride glass or others, is enclosed in a space formed between the light-radiation-direction-limiter 4a and the reflector 4b of the substrate 4, and the transparent aperture plate 6 in order to perform the sealing of the aforementioned semiconductor light-emitting element 2. At this time, since the aforementioned semiconductor light-emitting element 2 radiates near ultraviolet or ultraviolet, the aforementioned transparent sealing member 8 has preferably a high durability against the ultraviolet.

Consequently, depending on the output or the range of wavelength and so on of the aforementioned semiconductor light-emitting element 2 that radiates, for instance, nitrogen, argon or other inactive gas may be enclosed, and furthermore, the aforementioned space may be exhausted to make the space vacuous. In brief, sealing of the semiconductor light-emitting element 2 can be performed, and at the same time, it is free to choose gaseous, liquid, solid or whatever form, if the light can be transmitted without being deteriorated by the ultraviolet.

Figure 3:
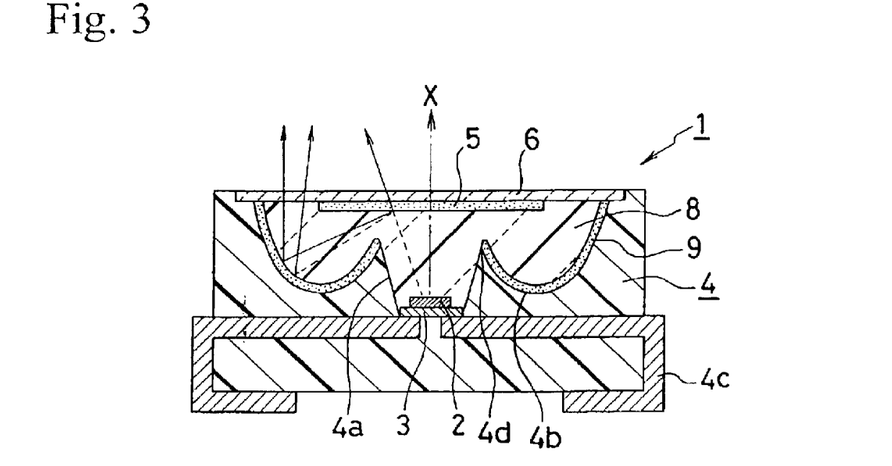
FIG. 3 is also a cross section showing the second embodiment of the light-emitting device according to the present invention.

FIG. 3 is the second embodiment of the light-emitting device 1 concerning the present invention. Though the first embodiment was described supposing that the wavelength converter 5 does not reflect the direct light from the semiconductor light-emitting element 2, many of the phosphors composing the aforementioned wavelength converter 5 are white, and it can be anticipated that some ultraviolet will be reflected.

In this case, in the aforementioned first embodiment, it is possible that ultraviolet reflected on the wavelength converter 5 reflects again on the reflector 4b and reaches the user and so on, because the aforementioned reflector 4b is white, or reflection film 7 is formed. Moreover in the aforementioned embodiment, if the ultraviolet is reflected as it is on the aforementioned wavelength converter 5, the reflected ultraviolet is never converted into visible light, which causes some loss in terms of quantity of light as well.

Therefore, in this second embodiment, the second wavelength converter 9 is provided on the aforementioned reflector 4b, and almost white phosphor as the wavelength converter 5 is adopted for composing this second wavelength converter 9. Therefore, the reflection efficiency is not particularly lowered in respect to the visible light (white light) converted by the wavelength converter 5.

Moreover, it is unnecessary to worry about the transmittance, since the second wavelength converter 9 does not make use of the side where light transmits through, while the wavelength converter 5 does. In this second wavelength converter, it is necessary and sufficient just to elevate the wavelength conversion efficiency. Based on the examination by the inventor for realizing this invention and the results of the trial manufactures, in respect of the conversion efficiency, it was effective to compose the film thickness of the second wavelength converter 9 in 1.5 to 3 times thicker than that of the wavelength converter 5.

Figure 4:
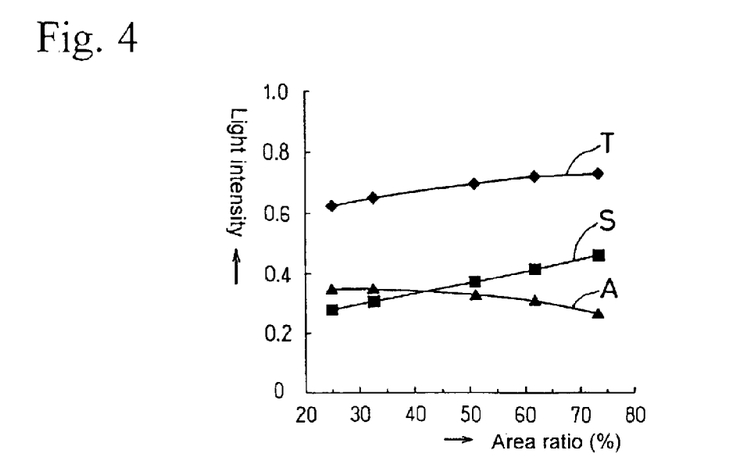
FIG. 4 is a graph showing the function of the light-emitting device according to the present invention.

FIG. 4 shows functions and effects of the light-emitting device 1 of the composition mentioned hereinbefore of the present invention with the example of the first embodiment. In this FIG. 4, the curved line shown with the symbol S indicates the amount of light transmitted through the wavelength converter 5, the curved line shown with the symbol A indicates the amount of light from the reflector 4b, and the curved line shown with the symbol T indicates the total value of both curved lines S and A. It should be noted that FIG. 4 shows the ratio of area that the wavelength converter 5 occupies in the opening of the substrate 4.

Here, when observing the curved line T indicating the total amount of light, though it is influenced by the variation of the ratio of area of the wavelength converter 5, the amount of light not less than 1.5 times of the value of the curved line S is secured at all times. In short, an increase of the amount of light not less than 1.5 times can be expected for the light-emitting device 1, because both transmitting light and reflection light from the wavelength converter 5 are made usable as irradiation light from the light-emitting device 1 by the present invention.

Figure 5:
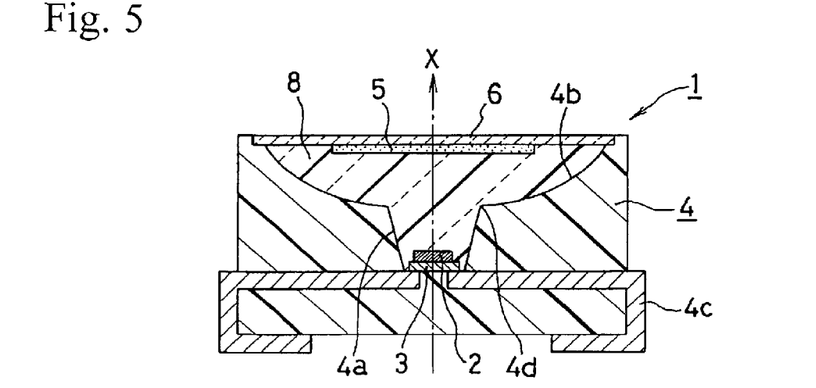
FIG. 5 is also a cross section showing the third embodiment of the light-emitting device according to the present invention.
Figure 6:
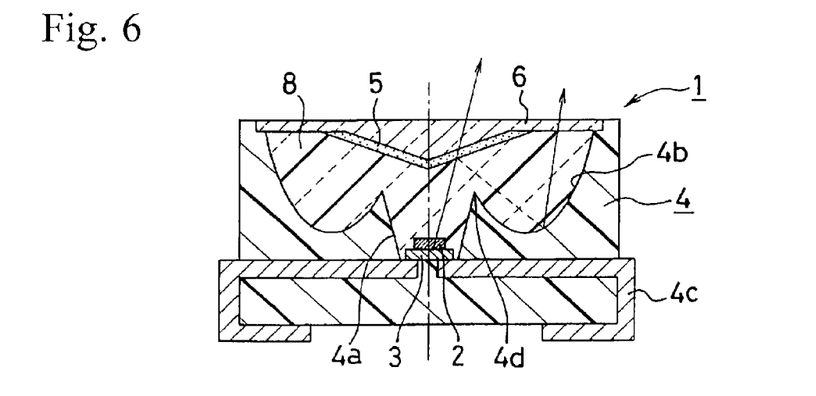
FIG. 6 is also a cross section showing the fourth embodiment of the light-emitting device according to the present invention.

It should be noted that, for the actual execution of the present invention, it is free to properly modify those objects shown in FIG. 1, concerning the forms of, for instance, light-radiation-direction-limiter 4a, reflector 4b, and wavelength converter 5. FIG. 5 shows the third embodiment wherein the shape of light-radiation-direction-limiter 4a and reflector 4b are modified, while FIG. 6 shows the fourth embodiment wherein the shape of wavelength converter 5 is modified.

Here, in the first and the second embodiments described above, a small diameter is made sufficient for the wavelength converter 5 by bringing the light-radiation-direction-limiter 4a close to the wavelength converter 5, and it is intended to secure a sufficient light path as well for the light from the reflector 4b; however, by doing so, a junction portion 4d protruding upward in the shape with an acute angle is created between the light-radiation-direction-limiter 4a and the reflector 4b, which lowers the productivity by deteriorating a mold release from the dies during the formation of the substrate 4, and so on.

In the third embodiment shown in FIG. 5, the substrate 4 is formed in such a shape not to create the junction portion 4d protruding upward and, basically, first, the light-radiation-direction-limiter 4a is set to a necessary minimum height and, the reflector 4b is formed on the top of the set light-radiation-direction-limiter 4 in a way to overlap.

By doing so, the substrate 4 increases in height direction and, at the same time, the wavelength converter 5 has to be formed rather larger than the first and the second embodiments in order to prevent the direct light of the semiconductor light-emitting element 2 from leaking, which will cause some decrease in the amount of light; however, it becomes easier to form the substrate 4, thus the productivity can be improved and the cost can be cut.

In the fourth embodiment shown in FIG. 6, when hardening the transparent sealing member 8, a conical recess is formed by aligning the axis above the light-radiation-direction-limiter 4a, and the wavelength converter 5 protruding conically towards the semiconductor light-emitting element 2 is formed by applying phosphor to this recess with proper means.

By doing so, the light transmitting through the wavelength converter 5 among the lights from the semiconductor light-emitting element 2 becomes the light transmitting through the aforementioned wavelength converter 5 at an angle, and the film thickness of the wavelength converter 5 becomes thicker, and consequently, the conversion efficiency of the conversion from ultraviolet light to visible light, for instance, gets improved. Moreover, reflection going towards the reflector 4b from the back will be performed efficiently because of the shape of the wavelength converter 5, thus the increase in the amount of light can be expected.

Figure 7:
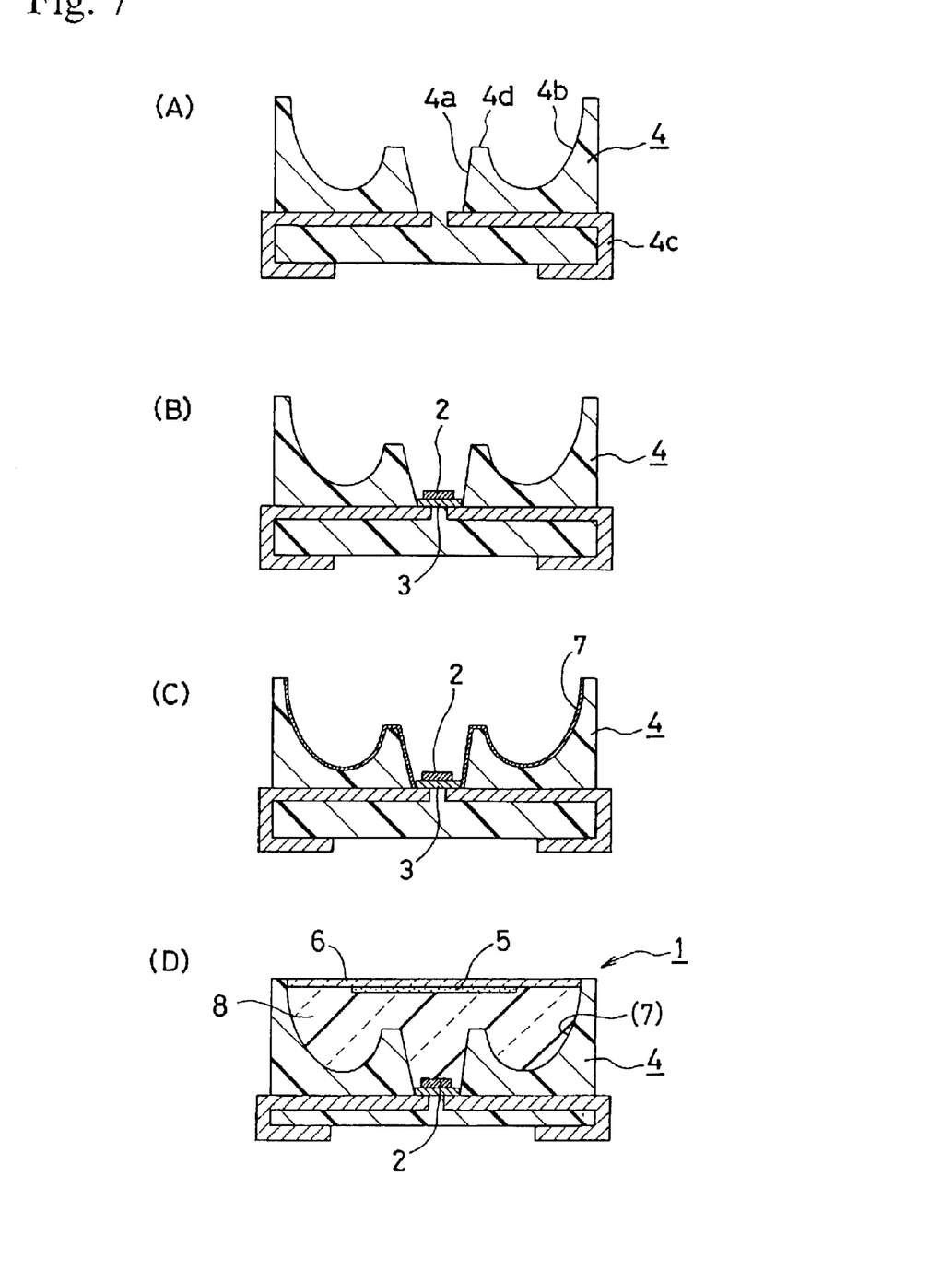
FIGS. 7A–7D are illustrative drawings showing a method of manufacturing the light-emitting device according to the present invention in the order of the processes.
Figure 8:
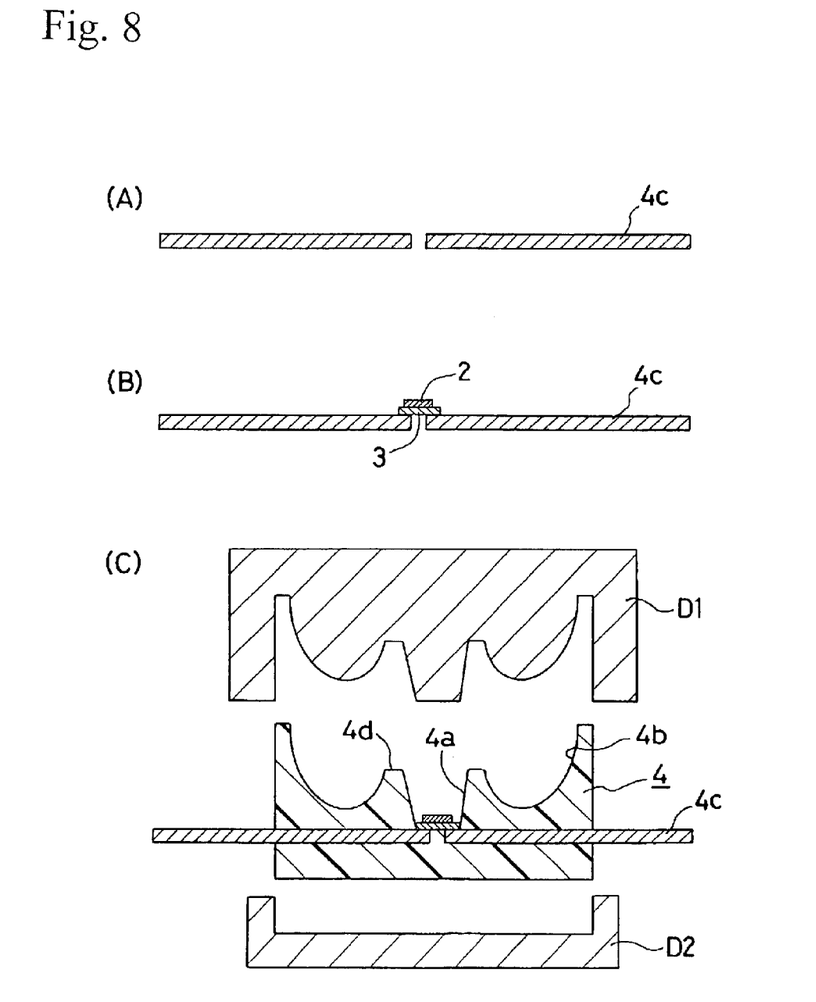
FIGS. 8A–8D are illustrative drawings showing an example of the processes in different order in the same method of manufacturing.

FIG. 7 and FIG. 8 show the manufacturing method of the light-emitting device 1 of the present invention in the order of its process. First of all, FIG. 7(A) is a process of forming the substrate 4, which forms the necessary sites, such as light-radiation-direction-limiter 4a, reflector 4b, junction portion 4d and so on by containing an electro-conductive portion 4c for supplying the aforementioned semiconductor light-emitting element 2 with power, and executing the resin formation by molding.

Then, as shown in FIG. 7(B), the die mount of semiconductor light-emitting element 2 is performed in the aforementioned electro-conductive portion 4c, allowing to supply the aforementioned semiconductor light-emitting element 2 with power from the outside. It should be noted that the processes shown in the aforementioned FIG. 7(A) to FIG. 7(B) may keep the semiconductor light-emitting element 2 in a die mount state previously on the electro-conductive portion 4c, as shown in FIG. 8(A) to FIG. 8(C), execute the resin formation including the aforementioned electro-conductive portion 4c thereafter using dies D1, D2, and form the substrate 4 including the light-radiation-direction-limiter 4a, reflector 4b, and junction portion 4d.

FIG. 7(C) shows the formation process of the light-radiation-direction-limiter 4a, and/or a reflection film 7 against the reflector 4b, or the second wavelength converter 9 (the illustration shows with a case of reflection film 7). When performing the mirror-plane-treatment with aluminum, silver and so on, they may be attached to the light-radiation-direction-limiter 4a and the reflector 4b by performing vacuum deposition or other proper means, and in case of fine powder form, such as barium sulfide, magnesium oxide, phosphor and others, they may be diffused in a proper binder and deposited by a painting means or others. It should be noted that the present process may be performed right after the process shown in FIG. 7(A).

FIG. 7(D) is the sealing process. The semiconductor light-emitting element 2 is mounted as described above, and an appropriate quantity of transparent sealing member 8, such as liquid epoxy resin before hardening, is injected into the recesses of light-radiation-direction-limiter 4a, reflector 4b and so on in the substrate 4, in which the reflection film 7 or the second wavelength converter 9 is formed. The upper part thereof is hardened by heating after being covered by the transparent aperture plate 6, in which wavelength converter 5 is formed.

It should be noted that, without using the aforementioned transparent aperture plate 6, phosphor may be deposited directly on the surface of the transparent sealing member 8 after performing the injection and the hardening in a predetermined dimensions, shape and position by silk-screen printing, potting or using other proper means for forming the wavelength converter 5. In this case, the wavelength converter 5 can be protected from peeling and so on by covering the aforementioned wavelength converter 5, injecting and hardening the transparent sealing member 8 again.

As mentioned herein above, according to the present invention, both the front-transmitted-wavelength-converted light and the front-transmitted-fundamental-wavelength light radiated to the front, and both the back-reflected-wavelength-converted light and the back-reflected-fundamental-wavelength light radiated to the back can be effectively used as output light of the light-emitting device, and are extremely effective for increasing the efficiency of this kind of light-emitting device.

If it is this composition, a problem, in which phosphor particulates in the resin precipitate because of the difference of specific gravity making the irregular dispersion, does not occur, because the wavelength converter is formed as dispersion of phosphor is dispersed in a liquid transparent sealing member, and is not affixed by a following hardening process. Also, a problem, in which luminous color deviates because of a current value impressed the semiconductor light-emitting element, because the reflectance and so on of the wavelength converter do not depend on the light emitting intensity of the semiconductor light-emitting element. This is extremely effective for improving the performance of this kind of light-emitting device.

In addition, when the semiconductor light-emitting element emits (near) ultraviolet, (near) ultraviolet that is not converted by the wavelength converter can also be converted into visible light by providing a second wavelength converter on the reflector side as well, enhancing the light emitting efficiency more, which allows to improve the light emitting efficiency more, and at the same time, to reduce the quantity of ultraviolet leakage to the outside. This is extremely effective for improving the safety.

While the presently preferred embodiment of the present invention has been shown and described, it will be understood that the present invention is not limited thereto, and that various changes and modifications may be made by those skilled in the art without departing from the scope of the invention as set forth in the appended claims.

What is claimed is:

1. A light-emitting device, comprising a substrate, a semiconductor light-emitting element mounted on the substrate, and a wavelength converter for absorbing a fundamental wavelength-light radiated from the semiconductor light-emitting element and converting it into a wavelength-converted light having a wavelength longer than the same, characterizing in being composed to allow the front-transmitted-wavelength-converted light transmitted to the front of said wavelength converter, back-reflected-wavelength-converted light converted in wavelength in said wavelength converter and reflected to the back, and back-reflected-fundamental-wavelength light not converted in wavelength in said wavelength converter and reflected to the back, among lights having attained said wavelength converter.

2. The light-emitting device of claim 1, comprising a light irradiation direction limiter for irradiating light from said semiconductor light-emitting element arranged with a proper interval on said wavelength converter by converging it into said wavelength converter, and a light reflector for reflecting said back-reflected-wavelength-converted light and said back-reflected-fundamental-wavelength light in the radiation direction of said light-emitting device.

3. A light-emitting device, comprising a substrate, a semiconductor light-emitting element mounted on the substrate and a wavelength converter by a phosphor for releasing a wavelength-converted light having a wavelength different from the fundamental wavelength-light radiated from said semiconductor light-emitting element, wherein:
said substrate is provided with a light-radiation-direction-limiter in the shape of a horn having an inner wall open upward on a substantially central portion having a function to limit the light-radiation-direction from said semiconductor light-emitting element and a reflector around said light-radiation-direction-limiter, said wavelength converter is arranged to cover an opening of said light-radiation-direction-limiter and not to come into contact with a limiter edge, and both of wavelength-converted light transmitted through said wavelength converter and radiated in the irradiation direction of said light-emitting element, fundamental-wavelength light reflected to the inner face of said wavelength converter, among lights having attained said wavelength converter, and/or light reflecting wavelength-converted light to the radiation direction of said light-emitting by said reflector can be taken out as output light.

4. The light-emitting device of claim 3, wherein:
said wavelength converter is provided with an interval not more than 10 mm from a surface of said semiconductor light-emitting element disposed at a bottom face of the light-radiation-direction-limiter arranged substantially at the central portion of said substrate, and at the same time, disposed to cover said light-radiation-direction-limiter.

5. The light-emitting device of claim 3, wherein:
a reflection film coated with material comprising one or more of aluminum, silver, barium sulfate and magnesium oxide is formed on said inner wall of said light-radiation-direction-limiter.

6. The light-emitting device of claim 3, wherein:
said inner wall of said light irradiation direction limiter is open in a range of 10° to 45° in respect to the main irradiation axis of said light-emitting device.

7. The light-emitting device of claim 3, wherein:
a reflection film coated with material comprising one or more of aluminum, silver, barium sulfate and magnesium oxide on a surface thereof is formed on said reflector.

8. The light-emitting device of claim 3, wherein:
said reflector has its surface coated with the wavelength converter.

9. The light-emitting device of claims 3, wherein:
said wavelength converter is a fluorescent agent activated by the light radiated from said semiconductor light-emitting element to emit light.

10. The light-emitting device of claim 3, wherein:
said wavelength converter installed in from of said semiconductor light-emitting element is formed in a ratio of 25 to 75% of the opening area composed by said light-radiation-direction-limiter and reflector arranged on said substrate.

11. The light-emitting device of claim 3, wherein:
said semiconductor light-emitting element is a compound semiconductor radiating light of 370 nm to 420 nm in light-emitting wavelength.

12. The light-emitting device of claim 1, wherein:
an optical thin film for reflecting selectively ultraviolet light is formed on a transparent aperture plate member for sealing the interior of said substrate.

13. The light-emitting device of claim 1, wherein:
said wavelength converter directs a face to a main irradiation axis of said light-emitting device to said semiconductor light-emitting element at an angle.

14. The light-emitting device of claim 3, wherein:
a reflection film coated with material comprising one or more of aluminum, silver, barium sulfate and magnesium oxide is formed on said inner wall of said light-radiation-direction-limiter;
said inner wall of said light irradiation direction limiter is open in a range of 10° to 45° in respect to the main irradiation axis of said light-emitting device.

15. The light-emitting device of claim 4, wherein:
a reflection film coated with material comprising one or more of aluminum, silver, barium sulfate and magnesium oxide is formed on said inner wall of said light-radiation-direction-limiter;
said inner wall of said light irradiation direction limiter is open in a range of 10° to 45° in respect to the main irradiation axis of said light-emitting device.

16. The light-emitting device of claim 14, wherein:
said reflector has its surface coated with the wavelength converter;
said wavelength converter is a fluorescent agent activated by the light radiated from said semiconductor light-emitting element to emit light;
said wavelength converter installed in front of said semiconductor light-emitting element is formed in a ratio of 25 to 75% of the opening area composed by said light-radiation-direction-limiter and reflector arranged on said substrate;
said semiconductor light-emitting element is a compound semiconductor radiating light of 370 nm to 420 nm in light-emitting wavelength.

17. The light-emitting device of claim 15, wherein:
said reflector has its surface, coated with the wavelength converter;
said wavelength converter is a fluorescent agent activated by the light radiated from said semiconductdr light-emitting element to emit light;
said wavelength converter installed in front of said semiconductor light-emitting element is formed in a ratio of 25 to 75% of the opening area composed by said light-radiation-direction-limiter and reflector arranged on said substrate;
said semiconductor light-emitting element is a compound semiconductor radiating light of 370 nm to 420 nm in light-emitting wavelength.

18. The light-emitting device of claim 14, wherein:
a reflection film coated with material comprising one or more of aluminum, silver, barium sulfate and magnesium oxide on a surface thereof is formed on said reflector;
said wavelength converter is a fluorescent agent activated by the light radiated from said semiconductor light-emitting element to emit light;
said wavelength converter installed in front of said semiconductor light-emitting element is formed in a ratio of 25 to 75% of the opening area composed by said light-radiation-direction-limiter and reflector arranged on said substrate;
said semiconductor light-emitting element is a compound semiconductor radiating light of 37 nm to 420 nm in light-emitting wavelength.

19. The light-emitting device of claim 15, wherein:
a reflection film coated with material comprising one or more of aluminum, silver, barium sulfate and magnesium oxide on a surface thereof is formed on said reflector;
said wavelength converter is a fluorescent agent activated by the light radiated from said semiconductor light-emitting element to emit light;
said wavelength converter installed in front of said semiconductor light-emitting element is formed in a ratio of 25 to 75% of the opening area composed by said light-radiation-direction-limiter and reflector arranged on said substrate;
said semiconductor light-emitting element is a compound semiconductor radiating light of 370 nm to 420 nm in light-emitting wavelength.

20. The light-emitting device of claim 16, wherein:
an optical thin film for reflecting selectively ultraviolet light is formed on a transparent aperture plate member for sealing the interior of said substrate.

21. The light-emitting device of claim 17, wherein:
an optical thin film for reflecting selectively ultraviolet light is formed on a transparent aperture plate member for sealing the interior of said substrate.

22. The light-emitting device of claim 18, wherein:
an optical thin film for reflecting selectively ultraviolet light is formed on a transparent aperture plate member for sealing the interior of said substrate.

23. The light-emitting device of claim 19, wherein:
an optical thin film for reflecting selectively ultraviolet light is formed on a transparent aperture plate member for sealing the interior of said substrate.

24. The light-emitting device of claim 16, wherein:
said wavelength converter directs a face to a main irradiation axis of said light-emitting device to said semiconductor light-emitting element at an angle.

25. The light-emitting device of claim 17, wherein:
said wavelength converter directs a face to a main irradiation axis of said light-emitting device to said semiconductor light-emitting element at an angle.

26. The light-emitting device of claim 18, wherein:
said wavelength converter directs a face to a main irradiation axis of said light-emitting device to said semiconductor light-emitting element at an angle.

27. The light-emitting device of claim 19, wherein:
said wavelength converter directs a face to a main irradiation axis of said light-emitting device to said semiconductor light-emitting element at an angle.

* * * * *

UNITED STATES PATENT AND TRADEMARK OFFICE
CERTIFICATE OF CORRECTION

PATENT NO. : 6,809,342 B2  
DATED : October 26, 2004  
INVENTOR(S) : Mitsunori Harada Page 1 of 1

It is certified that error appears in the above-identified patent and that said Letters Patent is hereby corrected as shown below:

Column 4,
Line 28, "45" should read -- 45° --;

Column 5,
Line 34, "15" should read -- 15°, --;

Column 10,
Line 35, "from" should read -- front --; and

Column 11,
Line 43, "37" should read -- 370 --.

Signed and Sealed this

Twentieth Day of September, 2005

JON W. DUDAS  
*Director of the United States Patent and Trademark Office*